United States Patent
Ebara (10) Patent No.: US 8,377,202 B2
(45) Date of Patent: Feb. 19, 2013

(54) METHOD FOR MANUFACTURING SILICON WAFER AND SILICON WAFER MANUFACTURED BY THIS METHOD

(75) Inventor: Koji Ebara, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 752 days.

(21) Appl. No.: 12/227,907

(22) PCT Filed: May 17, 2007

(86) PCT No.: PCT/JP2007/060103
§ 371 (c)(1),
(2), (4) Date: Dec. 2, 2008

(87) PCT Pub. No.: WO2007/148490
PCT Pub. Date: Dec. 27, 2007

(65) Prior Publication Data
US 2009/0242843 A1    Oct. 1, 2009

(30) Foreign Application Priority Data

Jun. 20, 2006 (JP) .................. 2006-169568
Dec. 19, 2006 (JP) .................. 2006-341876

(51) Int. Cl.
*C30B 15/14* (2006.01)
(52) U.S. Cl. .................. 117/3; 252/500; 257/E21.318; 423/349; 438/473
(58) Field of Classification Search ........... 257/E21.318; 438/473
See application file for complete search history.

(56) References Cited

U.S. PATENT DOCUMENTS

| | | | |
|---|---|---|---|
| 4,181,538 A * | 1/1980 | Narayan et al. | 438/473 |
| 4,575,466 A | 3/1986 | Iwai et al. | |
| 5,882,989 A | 3/1999 | Falster | |
| 5,968,264 A | 10/1999 | Iida et al. | |
| 5,994,761 A * | 11/1999 | Falster et al. | 257/611 |
| 6,077,343 A | 6/2000 | Iida et al. | |

(Continued)

FOREIGN PATENT DOCUMENTS

DE    33 45 075 A1    7/1984
JP    A-57-136334    8/1982

(Continued)

OTHER PUBLICATIONS

Yakir Siegal, "Time-Resolved Studies of Laser-Induced Phase Transitions in GaAs", Harvard University (May 1994) pp. 1-158.*

(Continued)

*Primary Examiner* — Melvin C Mayes
*Assistant Examiner* — Ross J Christie
(74) *Attorney, Agent, or Firm* — Oliff & Berridge, PLC (57) ABSTRACT

A method for manufacturing a silicon wafer having a defect-free region in a surface layer, in which at least only a surface layer region to a predetermined depth from a front surface of a silicon wafer to be processed is subjected to heat treatment at a temperature of not less than 1100 degrees C. for not less than 0.01 msec to not more than 1 sec, to thereby make the surface layer defect-free. As a result of this, there is provided a method for manufacturing a silicon wafer, in which a DZ layer without generation of crystal defects from the front surface to a constant depth can be uniformly formed, and oxide precipitates having a steep profile inside the wafer can be secured and controlled with a high degree of accuracy.

20 Claims, 6 Drawing Sheets

U.S. PATENT DOCUMENTS

| | | |
|---|---|---|
| 6,734,960 B1 * | 5/2004 | Goto et al. .................. 356/237.1 |
| 2003/0157814 A1 | 8/2003 | Iida et al. |
| 2003/0164139 A1 | 9/2003 | Kobayashi et al. |
| 2004/0102056 A1 | 5/2004 | Tobe et al. |
| 2006/0024442 A1 * | 2/2006 | Ovshinsky .................. 427/255.5 |
| 2006/0075960 A1 * | 4/2006 | Borgini et al. ................ 117/200 |
| 2007/0059904 A1 | 3/2007 | Izumome |
| 2007/0105279 A1 * | 5/2007 | Falster et al. ................ 438/113 |

FOREIGN PATENT DOCUMENTS

| | | |
|---|---|---|
| JP | A-59-124136 | 7/1984 |
| JP | A-5-275431 | 10/1993 |
| JP | A-9-162278 | 6/1997 |
| JP | A-11-79889 | 3/1999 |
| JP | 2000-053497 A | 2/2000 |
| JP | A-2001-503009 | 3/2001 |
| JP | A-2001-203210 | 7/2001 |
| JP | A-2001-517871 | 10/2001 |
| JP | A-2002-43318 | 2/2002 |
| JP | A-2002-134515 | 5/2002 |
| JP | A-2002-353225 | 12/2002 |
| JP | A-2007-80914 | 3/2007 |
| WO | WO 98/45507 A1 | 10/1998 |
| WO | WO 99/16119 A1 | 4/1999 |

OTHER PUBLICATIONS

Nov. 29, 2011 Office Action issued in European Application No. 07 743 538.6.

Aug. 21, 2012 Office Action cited in Japanese Patent Application No. 2006-341876 (with partial English Translation).

Dec. 11, 2012 Japanese Office Action issued in Japanese Patent Application No. 2006-341876 (with English Translation).

* cited by examiner

METHOD FOR MANUFACTURING SILICON WAFER AND SILICON WAFER MANUFACTURED BY THIS METHOD

TECHNICAL FIELD

The present invention relates to a method for manufacturing a silicon wafer and the silicon wafer manufactured by this method, in which a defect-free region without crystal defects is uniformly formed from a wafer front surface to a constant depth, and oxide precipitates having a steep profile inside the wafer can be secured and controlled with a high degree of accuracy.

BACKGROUND ART

Silicon wafers (hereinafter, it may also called "Si wafer") to be a material for semiconductor devices can be generally manufactured in such a way that a silicon single crystal is grown by the Czochralski method (Czochralski Method: hereinafter, it may also called the "CZ method") and the obtained silicon single crystal is subjected to processing steps of slicing, polishing, or the like.

The silicon single crystal grown by the CZ method in this way may cause an oxidation-induced stacking fault called OSF, which is generated in a ring shape when being subjected to thermal oxidation processing (for example, at 1100 degrees C.×for 2 hours). It has become clear that a micro defect (hereinafter, called Grown-in defect) which is formed during the crystal growth and has harmful effects on device performance exists other than OSF.

Accordingly, there has been recently disclosed a manufacturing method of the single crystal for obtaining wafers in which these defects are reduced as less as possible, in Japanese Unexamined Patent Publication (Kokai) No. H11-79889, for example.

Figure 5:
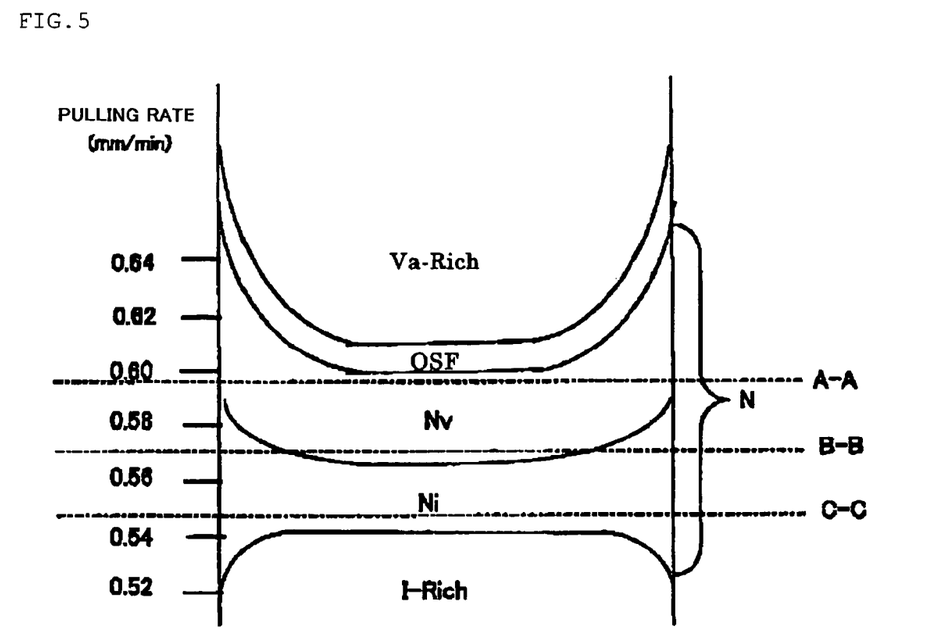
FIG. 5 is an explanatory view for describing a behavior of a change in crystal defect with respect to a pulling rate.

In letting a pulling rate during the single crystal growth be V (mm/min), and a mean value of a temperature gradient inside the crystal along a direction of a pulling axis be G (degree C./mm) in a temperature range from a silicon melting point to 1350 degrees C., according to the method disclosed by Japanese Unexamined Patent Publication (Kokai) No. H11-79889, FIG. 5 shows a relation between a pulling rate and a defect generation distribution when the single crystal is grown while changing V/G.

It has generally known that a temperature distribution G in the single crystal is dependent on a structure inside a CZ furnace (hereinafter, called hot zone) and thus the distribution will be hardly changed even when the pulling rate is changed. For this reason, V/G will correspond to only the change in the pulling rate if the CZ furnaces with the same structure are used. Namely, there is approximately a direct proportion relation between V and V/G. Hence, the pulling rate V is used for a vertical axis shown in FIG. 5.

In a region where V is relatively high, vacancy-type Grown-in defects called COP (Crystal Originated Particle) and FPD (Flow Pattern Defect) where vacancy-type point defects called a Vacancy (Vacancy: hereinafter, called Va) are gathered exist in all the areas of the crystal, and it is called a Va-Rich region.

OSFs are generated in a ring shape from the periphery of the crystal when V becomes slightly slower than this, OSFs are shrunk toward the center thereof as V becomes slower, and OSFs are finally annihilated in the center of the crystal.

When V is further slowed down, a Neutral (hereinafter, called N) region where excess and deficiency of Va and interstitial-type point defects called interstitial silicon (Interstitial Silicon: hereinafter, called I) is small exists. It has become clear that the defects do not exist or existence of the defects cannot be confirmed by a current defect detection method since the concentration of Va and I in this N-region is not more than a saturated concentration although there are deviations of Va and I.

The N-region is classified into an Nv region where Va is dominant and an Ni region where I is dominant.

When V is still further slowed down, I becomes supersaturated, and thus defects of L/D (Large Dislocation: abbreviation of interstitial dislocation loop, for example LSEPD, LEPD, or the like) considered to be a dislocation loop where I are gathered exist in lower density; it is called an I-Rich region.

When the Grown-in defect which exists in the Va-Rich region, the OSF region, or the I-Rich region appears in the wafer front surface, it has harmful effects on device properties, such as degradation of an oxide dielectric breakdown voltage or the like in forming a MOS (Metal Oxide Semiconductor) structure of the device, so that it is desired that there is no such defects in the wafer front surface layer.

Incidentally, oxygen of about $7\times10^{17}$ to $10\times10^{17}$ atoms/$cm^3$ (use the conversion factor based on JEITA: Japan Electronic Industry Development Association) is typically included in the Si wafer in a supersaturated state. For that reason, a large amount of Grown-in oxide precipitate nuclei exist in the Si wafer, and when the Si wafer is subjected to heat treatment during device processes or the like, supersaturation oxygen in the Si wafer precipitates as the oxide precipitates, and the Grown-in oxide precipitate nucleus grows to become obvious. The oxide precipitate like this is called BMD (Bulk Micro Defect).

Generation of this BMD in the device active region in the wafer causes problems since it has harmful effects on device properties, such as junction leakages, whereas it is effective to serve as a gettering site for capturing metal impurities mixed during the device processes as far as it exists in a bulk other than the device active region.

For that reason, in manufacturing the Si wafer, while the BMD must be formed into the bulk of the wafer, the vicinity of the wafer front surface which is the device active region must maintain a defect-free region (Denuded Zone; hereinafter, also called DZ layer) where neither the BMD nor the Grown-in defect exists.

In recent years, to these requests, there is disclosed a method for manufacturing a wafer in Japanese Unexamined Patent Publication (Kokai) No. 2002-353225, in which an ingot is manufactured in which growth of COP is suppressed and oxygen precipitation is promoted simultaneously by doping nitrogen when the silicon single crystal is grown by the CZ method, and a mirror wafer sliced from the ingot and polished is annealed at a high temperature for a long time (for example, at 1200 degrees C. for 1 hour) in an argon gas atmosphere to thereby annihilate COP near a surface layer and form the BMD in the bulk.

According to the method, the wafer is loaded into a heat treatment furnace at, for example, 700 degrees C., is heated at a rate of temperature increase of 5 degrees C./min up to 1000 degrees C. and at the rate of temperature increase of 3 degrees C./min from 1000 to 1200 degrees C. to keep it at 1200 degrees C. for 1 hour and subsequently is taken out from the furnace after lowering the temperature to 700 degrees C.

The reason why the rate of temperature increase from 700 to 1000 degrees C. is 5 degrees C./min is that if the temperature increase is larger than 5 degrees C./min, the sufficient BMD cannot be formed since the Grown-in oxide precipitate nuclei formed during the ingot pull-up process is partially dissolved during the temperature increase process.

However, although this method is effective in annihilating defects in the surface layer since annealing is performed at a high temperature and for a long time, it tends to increase processing cost and cause contamination during the heat treatment. Additionally, there is a problem that a slip is easy to be generated because of high temperature. Further, the BMD grows largely because of the heat treatment at a high temperature and for a long time, so that degradation in mechanical strength of the wafer is caused and the slip tends to be generated during the device process. Alternatively, there have been problems of easily causing plastic deformation or the like.

Figure 6:
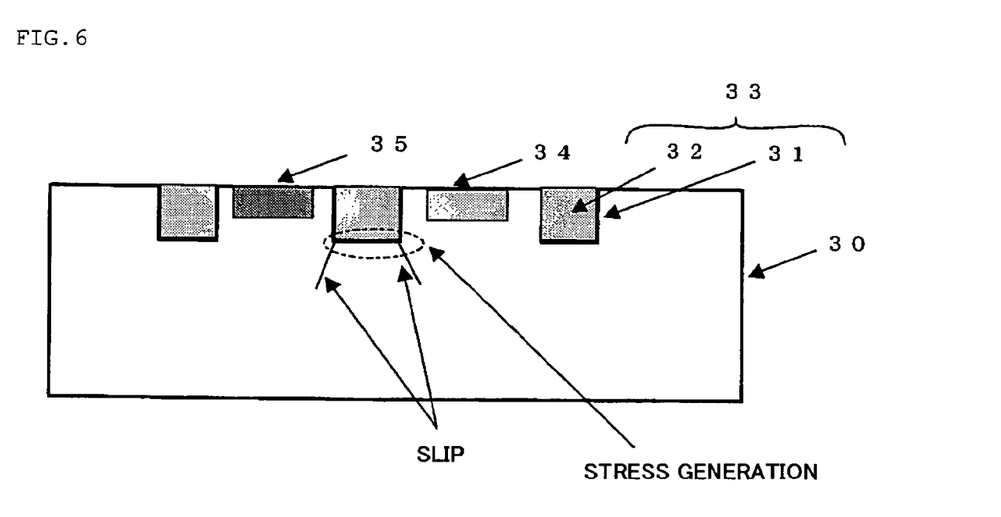
FIG. 6 is a schematic view showing a silicon wafer in which STI is formed.

Meanwhile, a method for forming a shallow trench to isolate devices, called shallow trench isolation (Shallow Trench Isolation: hereinafter, called STI) is adopted for most of the devices in recent years for device isolation. FIG. 6 schematically shows a cross section thereof.

After a shallow trench 31 is formed from a front surface of a silicon wafer 30 using anisotropic etching, a $SiO_2$ 32 is buried by CVD (Chemical Vapour Deposition), and thereby an STI 33 is formed. A device is formed between STIs 33.

In typical devices, an N-channel MOS transistor 34 and a P-channel MOS transistor 35 are formed, and both are isolated by the STI 33.

Since $SiO_2$ with a volume larger than that of Si is buried inside of this STI 33, tensile stress is generated in an interface between the STI 33 and the silicon in general, so that there have been problems that deformation of the Si wafer 30 and a slip are generated due to this stress. This stress is most remarkably generated at the bottom of the STI 33.

In order to relieve the stress generated at the bottom of the STI, it is known that it is extremely effective to form a steep and the high-density BMD and a strained layer in a position which is under the STI and as close as possible to the STI, and there is proposed a method in, for example, Japanese Unexamined Patent Publication (Kokai) No. H9-162278, in which oxygen atoms are introduced into the position under the STI region by ion implantation, heat treatment is subsequently performed to deposit the implanted oxygen atoms, and thereby the BMDs are formed directly under the STI.

Generally, in order to annihilate defects associated with oxygen, such as COP and OSF nucleus, oxide precipitates, or the like, since it is necessary to reduce an oxygen concentration to a solubility limit or less, the oxygen concentration is reduced to the solubility limit or less by reducing the oxygen concentration in the surface layer by utilizing out-diffusion of oxygen.

As a result, distribution of density and size of BMD which is the oxide precipitate in a depth direction becomes a distribution of making an oxygen concentration profile from the surface layer into a template, namely, an error functional distribution.

If the distribution in the depth direction of the BMD is the error functional distribution, a sufficiently steep BMD profile cannot be obtained to relieve the stress in the STI bottom. Additionally, when considering an oxygen concentration of radial distribution in the wafer in a radial direction, a width of the DZ layer in a region having a high oxygen concentration becomes narrow, so that it is necessary to make the DZ width in this region deeper than a depth of the STI. Meanwhile, since the width of the DZ layer in a region having a low oxygen concentration in radial direction becomes wider, the BMD can be formed only in a position far from the STI bottom, so that there has been a problem that the stress in the STI bottom cannot be relieved further.

The larger the radial variation of the oxygen concentration and the variation thereof among the wafers, the more remarkable this problem becomes.

Moreover, the oxygen concentration is reduced by the out-diffusion of oxygen, so that there has also been a problem that the mechanical strength of the DZ layer formed in the surface layer is also degraded.

As a method for solving the problems that the BMD size is increased due to the above-described high temperature and long time heat treatment, and the steep BMD profile is not obtained due to utilizing the out-diffusion of oxygen, a method for performing RTP (Rapid Thermal Process) processing to the Si wafer can be considered.

This RTP processing is a heat treatment method characterized in that the Si wafer is rapidly heated from a room temperature at a rate of temperature increase of, for example, 50 degrees C./sec in an atmosphere forming a nitride, such as $N_2$, $NH_3$, or the like, or a mixed gas atmosphere of these gases with an atmosphere of not forming the nitride, such as Ar, $H_2$, or the like, and is held at a temperature of about 1200 degrees C. for about a few tens sec, and subsequently is rapidly cooled down at a rate of temperature decrease of, for example, 50 degrees C./sec.

A mechanism that the BMD is formed by performing the oxygen precipitation heat treatment after the RTP processing is described in detail in Japanese Unexamined Patent Publication (Kokai) No. 2001-203210 and Published Japanese Translation No. 2001-503009 of the PCT International Application.

Here, the BMD forming mechanism will be described simply.

First, in the RTP processing, injection of Va is generated from the wafer surface in keeping high temperature of, for example, 1200 degrees C. in the $N_2$ atmosphere, and re-distribution due to diffusion of Va, and annihilation with I are caused while cooling down the wafer at a rate of temperature decrease of 5 degrees C./sec in a temperature range of 1200 degrees C. to 700 degrees C. As a result, it becomes a state where Va is unevenly distributed in the bulk.

If the wafer in such a state is subjected to heat treatment at, for example, 800 degrees C., oxygen clusters quickly in the high Va concentration region, but oxygen clustering is not generated in the low Va concentration region.

If heat treatment is subsequently performed for a certain period of time at, for example, 1000 degrees C. in this state, the clustered oxygen grows and the BMD is formed. As described above, if the oxygen precipitation heat treatment is applied to the Si wafer after the RTP processing, the BMD which has the distribution in a wafer depth direction will be formed according to a concentration profile of Va formed by the RTP processing.

Hence, a desired Va concentration profile is formed in the Si wafer by controlling conditions of the atmosphere, the highest temperature, the holding time or the like of the RTP processing, and thereafter, by performing the oxygen precipitation heat treatment to the Si wafer obtained, Si wafer having a desired DZ width and a desired BMD profile in the depth direction is manufactured.

As described above, in the case of the RTP processing, although the DZ layer is not formed utilizing the out-diffusion of oxygen, Va is newly injected by the RTP processing to form the DZ layer utilizing out-diffusion of this Va, so that the steep BMD cannot be formed fundamentally.

Additionally, a point that the DZ layer width varies due to the variation in oxygen concentration is not different from a method of utilizing the out-diffusion of oxygen, either.

Meanwhile, since the RTP processing is short-time heat treatment, there is an advantage that the BMD size does not increase. However, there is a problem that when the Grown-in defects such as COP or L/D exist in the Si wafer to be the material, these types of defects cannot be sufficiently annihilated because the heat treatment is performed for an extremely short time.

Namely, it is possible to secure a region where the BMD is not generated to a certain depth in the surface layer when the Si wafer having the Grown-in defects is subjected to the RTP processing, but when speaking of the Grown-in defects, although the Grown-in defects can be annihilated in a very shallow region of the surface layer by the RTP processing, the Grown-in defects cannot be annihilated in a region deeper than that to result in a state where they still exist, and thus the whole device active region cannot be made defect-free. For this reason, there have also been problems that device properties are degraded.

In addition, another method for forming the DZ layer in the surface layer is disclosed in Published Japanese Translation No. 2001-517871 of the PCT International Application.

This is a method in which a light pulse is irradiated from the wafer front surface for about 1 to 5 sec to heat up the front surface at about 1000 degrees C. while the wafer back surface is fixed to a heat sink to keep it at a temperature of less than 900 degrees C., thereby a temperature distribution is decreased from the wafer front surface toward the wafer back surface, and thus the DZ layer is formed near the front surface. However, even such a method could not make the BMD profile of the interface between the DZ layer and a BMD layer steep.

DISCLOSURE OF THE INVENTION

The present invention is made in view of the aforementioned problems, and an object of the present invention is to provide a method for manufacturing a silicon wafer, in which the Grown-in defects and oxide precipitate nuclei formed in the single crystal growth step are annihilated only in the wafer surface layer without annihilating the Grown-in defects and oxide precipitate nuclei in the bulk region of the wafer, thereby the DZ layer without crystal defects from the front surface toga constant depth can be uniformly formed without being affected by the influence of the variation in oxygen concentration in the radial direction of the wafer and between the wafers, and the oxide precipitates having a steep profile inside the wafer can be secured and controlled with a high degree of accuracy.

Moreover, another object of the present invention is to provide a silicon wafer, in which there is no decrease in oxygen concentration in the DZ layer, the DZ layer having a uniform oxygen concentration distribution over the whole DZ layer is uniformly formed, and the oxide precipitates having a steep profile inside the wafer can be secured and controlled in an earlier step of the device process with a high degree of accuracy.

In order to achieve the aforementioned object, the present invention provides a method for manufacturing a silicon wafer having a defect-free region in a surface layer, the method is characterized in that at least only a surface layer region to a predetermined depth from a front surface of a silicon wafer to be processed is subjected to heat treatment at a temperature of not less than 1100 degrees C. for not less than 0.01 msec to not more than 1 sec, to thereby make the surface layer defect-free.

According to the above-described manufacturing method, only the surface layer can be heated to a high temperature, without heating a bulk region of the wafer to a high temperature, so that without reducing, annihilating, growing the Grown-in defects and oxide precipitate nuclei, and the BMDs in the bulk region, they can be sufficiently annihilated only in the surface layer.

Hence, a silicon wafer in which the DZ layer is formed in the surface layer and in which the grown-in defects and oxide precipitate nuclei or the like are formed in, for example, the single crystal growth is used as a template in the bulk region can be provided. For that reason, pulling conditions, the oxygen concentration, and the like are controlled so as to obtain a desired BMD or the like in the silicon single crystal growth, and the present invention is implemented to the silicon wafer sliced from this single crystal, thereby it is possible to obtain the silicon wafer having a desired BMD profile.

Incidentally, it is sufficient that the heating temperature is 1100 degrees C. or more, and the heating temperature can be set to a silicon melting point (1412 degrees C.) or less, but since defects and oxide precipitates can be dissolved in a short time as the temperature becomes higher, it is preferable to be set to 1200 degrees C. or more, in particular.

Meanwhile, if the heating temperature is less than 1100 degrees C., it takes several minutes or more for the heat treatment in order to completely annihilate the Grown-in defect. However, when the heat treatment is performed for several minutes in this way, equalization of the temperature of the whole wafer is promoted due to heat conduction, not only the temperature of the surface layer but also that of the bulk region are increased, and a part of the oxide precipitates of bulk is also dissolved, and thus it will become impossible to obtain a steep BMD profile.

Performing extremely short heat treatment for not less than 0.1 msec and not more than 1 sec only to the surface layer region at a high temperature of 1100 degrees C. or more as the present invention makes it possible to prevent the whole wafer from being heated to a high temperature due to the heat conduction without heating the bulk region, and allowing the BMD profile of the interface between the DZ layer and a BMD layer to be steep.

Incidentally, this surface layer region to a predetermined depth from the front surface of the silicon wafer to be processed can be determined so that the DZ layer can be formed in a desired depth, in which its depth is not particularly limited, but can be suitably set according to conditions such as device formed in the front surface, STI, or the like. For example, it can be set as the depth of 20 μm or less.

Here, it is preferable that the whole silicon wafer to be processed is previously heated at not less than 500 degrees C. to less than 1100 degrees C. when performing the heat treatment.

As described above, if the whole silicon wafer to be processed is previously heated at not less than 500 degrees C. to less than 1100 degrees C. when performing the heat treatment, it is possible to perform the heat treatment of the surface layer region more effectively and to heat it at higher temperature than a case where such pre-heating of the whole wafer is not performed, thus allowing heating efficiency of the surface layer to be greatly improved.

Additionally, in a temperature range of 500 to 700 degrees C. within a temperature range of this pre-heating, dissolution of the Grown-in oxide precipitate nuclei is not generated, and conversely, growth and stabilization of the oxide precipitate nuclei can be achieved and new precipitate nuclei can also be formed, and thus it is possible to control an increase in BMD by controlling the temperature in this temperature range.

Meanwhile, although the Grown-in oxide precipitate nuclei will be partially dissolved in a temperature range of 700 to 1100 degrees C., diffusion of oxygen is increased because the temperature is higher than 500 to 700 degrees C., so that they can grow in a shorter time, thus allowing BMD density to be reduced and the BMD with a large size to be formed.

As described above, controlling the temperature and time of the pre-heating makes it possible to control the BMD density and size in the bulk region. Additionally, pre-heating also makes it possible to annihilate oxygen donors formed in the bulk region.

Accordingly, donor-annihilation heat treatment and DZ layer forming heat treatment can be simultaneously processed, so that simplification in process and reduction in cost can be planned.

Further, the heat treatment can be performed by irradiating a laser beam with a wavelength of 0.3 to 15 µm to the silicon wafer to be processed.

If the heat treatment is performed by irradiating the laser beam with a wavelength of 0.3 to 15 µm to the silicon wafer to be processed as described above, a laser irradiation area is typically several square centimeters or less in a laser annealing apparatus, and a temperature difference between the wafer front surface and the wafer back surface upon irradiation is generated not in the whole area of the wafer but in a local area thereof, so that thermal stress during heating can be reduced, thus allowing slip occurrence and wafer breakage by heating to be effectively prevented.

Further, since the temperature can be increased to a high temperature as 1200 to 1400 degrees C. in a time of 0.1 msec or less in particular, even defects with a large size can sufficiently be annihilated in a short time.

Hence, since a margin of the pulling rate when pulling the silicon single crystal used as, for example, the basis of the silicon wafer to be processed by the Czochralski method can be expanded, a reduction in manufacturing cost of the single crystal and thus silicon wafer can be planned.

Still further, the heat treatment can be performed by irradiating a laser beam with a wavelength of 0.7 to 15 µm to the silicon wafer to be processed at a Brewster angle.

Since the absorption coefficient of silicon is small when the wavelength is not less than 0.7 µm, a penetration depth of light is increased, so that the wafer up to a relatively deep position will be heated. Consequently, if it is desired to heat only a slight surface layer, the light is irradiated at the Brewster angle, thereby only the surface layer can be heated more effectively since the light is totally reflected on the slight surface layer.

At this time, the heat treatment can be performed in a non-oxidizing atmosphere of argon, hydrogen, or a mixed gas thereof.

When the heat treatment is performed in the non-oxidizing atmosphere as described above, an equilibrium concentration of oxygen in the front surface is lower than that of the oxidizing atmosphere, and thus out-diffusion of oxygen becomes efficient. As a result of this, since an oxygen concentration near the front surface can be reduced to be lower than the solubility limit more fast, the Grown-in oxide precipitate nuclei and defects further tend to annihilate, so that it is possible to plan improvement in quality level particularly in the slight surface layer.

Meanwhile, when the heat treatment is performed in a hydrogen atmosphere, defects resulting from the oxide precipitates are further dissolved easily by the reducing action, and thus allowing improvement in front surface quality level to be further planned.

Further, the heat treatment can be performed in an atmosphere forming nitride film of nitrogen or ammonia.

When the heat treatment is performed in the atmosphere forming nitride film as described above, it is known, as described in Published Japanese Translation No. 2001-503009 of the PCT International Application, that vacancies are efficiently injected into the inside of the wafer, and the injected vacancies promote the oxygen precipitation.

Thus, the oxygen precipitation is promoted by vacancy injection, and at the same time, annihilation of the Grown-in oxide precipitate nuclei during heating is further suppressed. Namely, as compared with a case of heating the wafer in an atmosphere without the vacancy injection not in such an atmosphere forming nitride film, a width of the DZ layer can be reduced.

Meanwhile, the heat treatment can be performed in an oxygen atmosphere. When the heat treatment is performed in the oxygen atmosphere as described above, interstitial Si(I) is injected and the oxide precipitate nuclei are more easily dissolved, and thus allowing the width of the DZ layer to be expanded. Alternatively, it is possible to form the DZ layer by heat treatment of lower temperature/shorter time.

In addition, it is preferable that the silicon wafer to be processed is a wafer that is sliced from a silicon single crystal ingot with an oxygen concentration of not less than 7 ppma to not more than 20 ppma, the ingot being grown by the Czochralski method.

If the oxygen concentration is 7 ppma or more as described above, the Grown-in oxide precipitate nuclei properly exist in the single crystal and the silicon wafer sliced therefrom, so that the oxide precipitate nuclei grow by the heat treatment in the device process and the BMD is formed, and thus allowing a gettering function to be provided.

Then, since the oxygen concentration is 20 ppma or less, the size of the Grown-in defect and oxide precipitate nuclei formed during the crystal growth does not become needlessly large, thus allowing an increase in cost due to a long heat treatment time to be prevented. Meanwhile, since the degree of supersaturation of oxygen is not too large originally, annihilating the oxide precipitate nuclei in the surface layer by the present invention makes it possible to effectively prevent that oxygen re-precipitates and the BMD appears on the front surface, even when the heat treatment is performed in the device process.

Thus, the above range of the oxygen concentration in which new oxide precipitate nuclei are not formed in the usual device heat treatment is preferable. It is more preferable to be 15 ppma or less, and still more preferable to be 13 ppma or less.

Further, it is preferable that the silicon wafer to be processed is a wafer that is sliced from a silicon single crystal ingot with a nitrogen concentration of $1 \times 10^{11}$ to $1 \times 10^{15}$ atoms/cm$^3$, the ingot being grown by the Czochralski method.

As described above, since the size of the Grown-in defect can be reduced by making nitrogen to be contained in the concentration of $1 \times 10^{11}$ to $1 \times 10^{15}$ atoms/cm$^3$, the defects in the surface layer can be annihilated by heat treatment of lower temperature/shorter time than a case where nitrogen is not doped, and thus it is effective.

Moreover, it is also known that BMD formation is promoted and mechanical strength of the wafer is increased by making nitrogen to be contained, and there are also advantages that slip generation during the heat treatment can be suppressed and a control range of the BMD can be expanded.

Still further, it is preferable that the silicon wafer to be processed is a wafer that is sliced from a silicon single crystal ingot with a carbon concentration of $1 \times 10^{16}$ to $1 \times 10^{17}$ atoms/cm$^3$, the ingot being grown by the Czochralski method.

It is known that if carbon is contained in the concentration of $1\times10^6$ to $1\times10^{17}$ atoms/cm$^3$ as described above, the BMD is more easily formed by the heat treatment of the device process, and it is advantageous.

Additionally, carbon serves as a catalyst when oxygen fixes dislocations of slip or the like, and the slip can be suppressed.

Yet still further, it is preferable that the silicon wafer to be processed is a wafer that is sliced from a silicon single crystal ingot whose whole area in a radial direction is an N-region, the ingot being grown by the Czochralski method.

If the wafer is sliced from the single crystal ingot of the N-region as described above, the Grown-in defects, such as COP or OSF nucleus, do not exist in the sliced silicon wafer, and only the oxide precipitate nuclei which can be annihilated in lower temperature/shorter time than the Grown-in defects exist. For this reason, it is effective for reducing the cost of the heat treatment in the present invention to make the surface layer defect-free.

In addition, since the wafer can be processed at a lower temperature, it is advantageous also in respect of a reduction in contamination or slip.

Yet still further, it is that the silicon wafer to be processed is a wafer that is sliced from a silicon single crystal ingot grown by the Czochralski method and is subjected to heat treatment at least 400 to 900 degrees C. for 30 min or more to 4 hours or less.

If it is the silicon wafer subjected to such heat treatment, the oxide precipitate nuclei formed during the crystal growth can be grown and also new oxide precipitate nuclei can be formed, and thus allowing the BMD density to be further increased.

Hence, it is possible to control the BMD in a wider range by controlling the heat treatment temperature and time appropriately.

Setting the temperature of the heat treatment to not less than 400 degrees C. makes it possible to properly cause the diffusion of oxygen, and thus allowing the BMD to be grown efficiently.

Additionally, setting the temperature of the heat treatment to not more than 900 degrees C. makes it possible to newly form the oxide precipitate nuclei, and also to prevent the BMD from being reduced without partially dissolving the oxide precipitate nuclei formed in the crystal growth step. Meanwhile, when the heat treatment time is set to not more than 4 hours, the size of the oxide precipitate does not become too large, so that it is possible to prevent the heat treatment time taken for the dissolution thereof from increasing.

Such heat treatment is advantageous in a cost aspect if it is duplicated with donor annihilation heat treatment.

Yet still further, it is possible that the silicon wafer to be processed is a wafer that is sliced from a silicon single crystal ingot grown by the Czochralski method and that at least is rapidly heated to 1100 to 1300 degrees C. at a rate of temperature increase of not less than 5 degrees C./sec in a non-oxidizing atmosphere to keep it for 1 to 60 sec and subsequently is rapidly cooled at a rate of temperature decrease of not less than 5 degrees C./sec using a rapid heating and rapid cooling apparatus.

If it is the silicon wafer subjected to such heat treatment, vacancies are injected into the inside of the wafer by rapidly cooling the wafer after rapidly heating it in the non-oxidizing atmosphere, and the oxygen precipitation is promoted by using the injected vacancies as a template to thereby allow the BMD with a wider range to be formed.

It is then preferable that the silicon wafer to be processed is a wafer whose front surface is subjected to polishing processing.

In the present invention, it is not necessary to make the back surface of the wafer contact to a heat sink upon heating as, for example, the above-mentioned conventional method, and for that reason, the DZ layer can be formed without damaging a mirror surface state of especially the back surface of the wafer whose surfaces (including the back surface) are subjected to the polishing process, to be subjected to the next process. Hence, the mirror surface state on the back surface is secured, and thus allowing the wafer with higher device properties to be provided.

The silicon wafer manufactured by the method for manufacturing the silicon wafer according to the above-described present invention is a wafer, in which the DZ layer is formed while annihilating the Grown-in defects and oxide precipitate nuclei only in the surface layer region from the front surface to a predetermined depth, and the BMD profile becomes steep in the interface between this DZ layer and the BMD layer of the bulk region.

As described above, the present invention makes it possible to uniformly form the DZ layer where the crystal defects are not generated from the front surface to the constant depth without being affected by the influence of the variation in oxygen concentration in the radial direction of the wafer and between the wafers by annihilating the Grown-in defects and oxide precipitate nuclei formed in, for example, the single crystal growth step only in the surface layer without annihilating the Grown-in oxide precipitate nuclei and crystal defects in the bulk. Additionally, since there is no decrease in oxygen concentration in the DZ layer and a uniform oxygen concentration distribution is provided over the whole DZ layer, the DZ layer whose mechanical strength is not degraded can be uniformly formed and further the silicon wafer that can secure and control the oxide precipitates having a steep profile inside the wafer with a high degree of accuracy can be manufactured.

BEST MODES FOR CARRYING OUT THE INVENTION

Hereinafter, embodiments of the present invention will be described, but the present invention is not limited thereto.

In manufacturing silicon wafers, it is required to form the BMD to be a gettering site in the bulk region of the wafer, and also to form the DZ layer in which neither the aforementioned BMD nor the crystal defect exists, in the surface layer region of the wafer to be the device active region.

Meanwhile, although a method of forming a shallow trench called STI to thereby isolate between devices for device isolation is employed in most of the devices in recent years, tensile stress in the interface between $SiO_2$ and silicon inside the STI, which will be a cause of deformation of the silicon wafer and slip generation is remarkable at this STI bottom. As an effective method of relieving the stress, it is known that a steep and high-density BMD layer is formed near the STI bottom.

There is required a silicon wafer in which the DZ layer is formed in the surface layer and the BMD layer is formed in the bulk region, and the BMD profile is steep in the interface between the DZ layer and the BMD layer as described above.

Meanwhile, in order to obtain the silicon wafer which has the DZ layer in the surface layer and has the BMD layer in the bulk region, the conventional method includes the method utilizing out-diffusion of oxygen and the method by the RTP processing, for example.

By these methods, however, the BMD size becomes too large, mechanical strength is degraded due to a decrease in oxygen concentration in the surface layer, and in addition to that, a steep BMD profile cannot be obtained.

Further, while utilizing effectiveness of the RTP processing that the BMD size does not increase easily, there is considered a method of slicing the wafer from the N-region of the single crystal in which agglomeration of Va and agglomeration of I do not exist to then perform the RTP processing to the wafer in which the whole area of the wafer is composed of an N-region by, for example, a method disclosed in Japanese Unexamined Patent Publication (Kokai) No. 2001-203210.

It is considered in the case of this method that performing the RTP processing to the wafer may not cause any problems since the Grown-in defect does not exist in the silicon used as a material, but as a result of earnest investigations by the present inventor, it was found that even when the silicon wafer whose whole area is an N-region is prepared, the oxide dielectric breakdown voltage of an Nv region in the wafer is degraded in some cases when the oxide dielectric breakdown voltage is measured after performing the RTP processing.

As a result of further earnest investigations, it was found that the degradation in oxide dielectric breakdown voltage is remarkably caused in a portion near the OSF region within the Nv region, namely, in a region where Va concentration is relatively high even in the Nv region where the agglomeration of Va is not generated.

Although a cause that the oxide dielectric breakdown voltage is degraded after the rapid heat treatment in spite of using the silicon wafer whose whole area is an N-region is not clear, it is considered the cause is that the Nv region which tends to form the oxide precipitate originally becomes to cause oxygen precipitation more easily because of the Va injection by the RTP processing and thus the oxide precipitate, namely, the BMD appears on the front surface, or alternatively, a total sum of Va injected by the RTP processing and Va which originally existed in the Nv region became the saturated concentration or more and thus Va agglomerate to form the vacancy-type defect.

Hence, it became clear that certain processing for annihilating the defect such as the oxide precipitate or the vacancy-type defect which appears on the front surface by performing the RTP processing is required even in the case of the wafer where the wafer whose whole area is an N-region is subjected to the RTP processing.

As a result of repeated investigations about the above problem, the present inventor considered that the primary cause of the above-mentioned problem is to heat the whole wafer.

Namely, when the whole wafer is heated to, for example, 700 degrees C. to 1200 degrees C. with a relatively fast rate of temperature increase of not less than 5 degrees C./min to then keep it at 1200 degrees C., for example, for 1 hour, the defects in the surface layer can be annihilated, but the oxide precipitate nuclei which exist in bulk simultaneously are also annihilated, so that BMD density required for gettering cannot be sufficiently secured.

On the contrary, when the rate of temperature increase is set to not more than 5 degrees C./min so as not to annihilate the Grown-in oxide precipitate nuclei in the bulk, a time required for the temperature rise is increased, and the oxide precipitate nucleus grows to a desired size or more due to an increase in total heat treatment time, and thus the BMD that has a needlessly large size will be formed.

There are problems such that mechanical strength of the wafer is degraded and the BMD itself becomes a source of generating the stress by the large sized BMD, resulting in a source of generating the deformation of the wafer and the slips, and disadvantages of causing an increase in cost or the like.

Namely, in order to control a trade-off phenomenon to annihilate the defects and the oxide precipitate nuclei in the surface layer and to grow the oxide precipitate nuclei in the bulk under the heat treatment conditions for uniformly heating the whole wafer, a large constraint is produced.

Additionally, the out-diffusion of oxygen is utilized for the defect annihilation in both cases, and it becomes a BMD distribution using the oxygen concentration profile in a depth direction as a template, so that the steep BMD profile required for the stress relaxation in the STI portion cannot sufficiently be obtained in a position close to the STI bottom.

Consequently, the present inventor considered that these problems could be solved by heating the surface layer and the bulk at different temperatures, and completed the present invention.

Hereinafter, a method for manufacturing a silicon wafer of the present invention will be described in detail with reference to the drawings.

Figure 1:
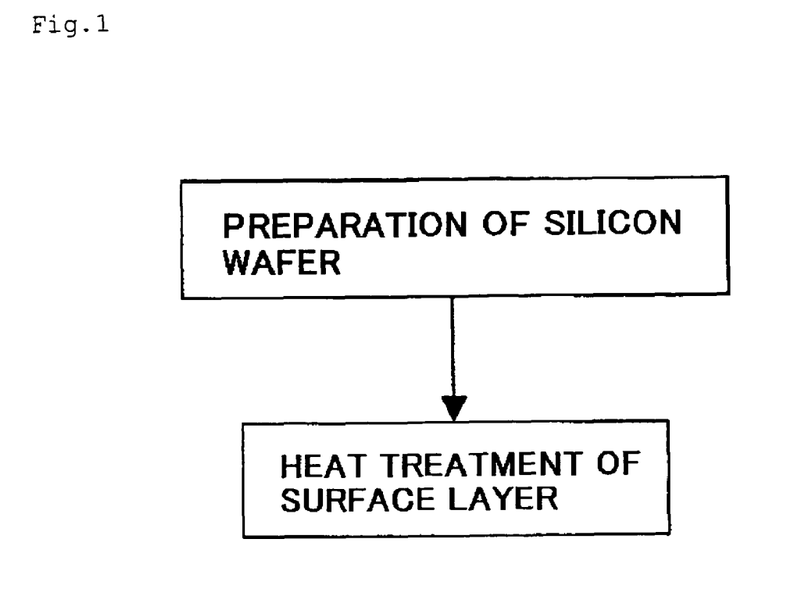
FIG. 1 is a flow chart showing one example of a procedure of a method for manufacturing a silicon wafer of the present invention.

One example of an implementing procedure of the method for manufacturing the silicon wafer according to the present invention is shown in FIG. 1 as a flow chart.

First, a whole flow of the implementing procedure will be described. First, a silicon wafer to be processed is prepared. Although the silicon wafer prepared here is not limited in particular, the quality level of the silicon wafer to be processed can be determined previously so that the silicon wafer with a desired quality level may be easily obtained by the manufacturing method of the present invention.

Making the silicon wafer to be processed be a desired quality level (BMD, Grown-in defect, or the like) as described above includes adjusting each condition when pulling the silicon single crystal ingot which is the basis of the silicon wafer to be processed by a Czochralski method, for example.

Further, the silicon wafer sliced from this silicon single crystal ingot is subjected to processing of heating or the like to thereby make it be the silicon wafer to be processed having the desired quality level.

Only a surface layer region to a predetermined depth from a front surface of the obtained silicon wafer to be processed is subjected to heat treatment at a temperature of not less than 1100 degrees C., for not less than 0.01 msec to not more than 1 sec, thereby it is possible to form the DZ layer in the surface-layer and the BMD layer sufficiently serving as a gettering function in the bulk region, and further to manufacture the silicon wafer with the steep BMD profile in the interface between the DZ layer and the BMD layer.

Here, apparatuses which can be used for aforementioned each process will be described by giving examples, respectively.

Figure 2:
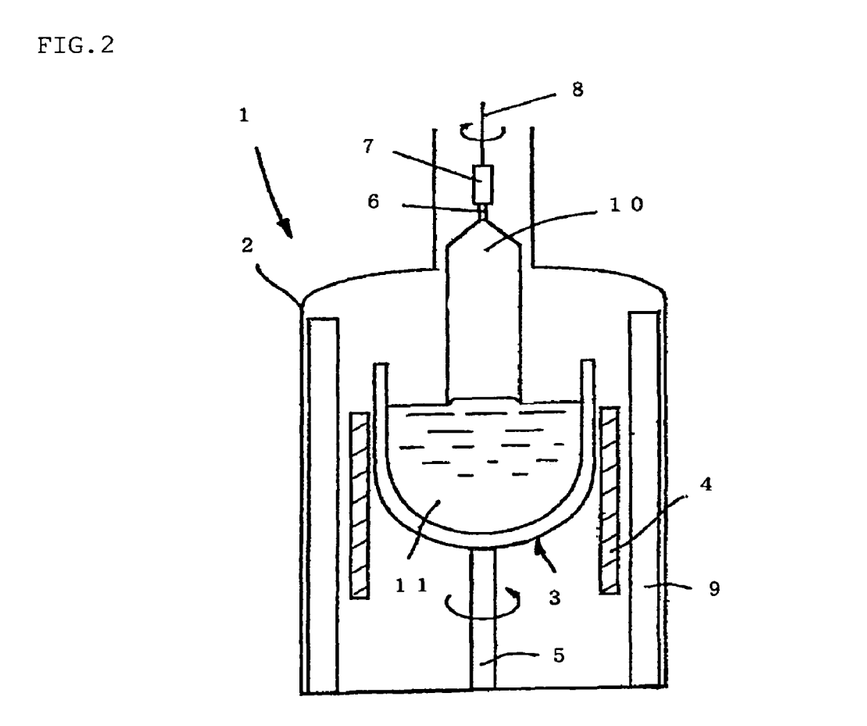
FIG. 2 is a schematic view showing one example of a single crystal pulling apparatus which can be used for the method for manufacturing the silicon wafer of the present invention.

In pulling the silicon single crystal by the Czochralski method, a single crystal pulling apparatus shown in FIG. 2 can be used, for example.

As shown in FIG. 2, this single crystal pulling apparatus 1 is composed of by being provided with a pull chamber 2, a crucible 3 provided into the pull chamber 2, a heater 4 arranged around the crucible 3, a crucible holding shaft 5 for turning the crucible 3 and a turning mechanism thereof (not shown), a seed chuck 7 for holding a silicon seed crystal 6, a wire 8 for pulling the seed chuck 7, and a winding mechanism for turning or winding the wire 8 (not shown). In addition, a heat insulating material 9 is arranged around the outside of the heater 4.

A silicon single crystal 10 is pulled from a silicon melt 11 to be a raw material by the wire 8.

Next, an apparatus for applying, for example, rapid heating and rapid cooling to the silicon wafer sliced from the silicon single crystal 10 pulled by the aforementioned single crystal pulling apparatus 1 will be described.

Figure 3:
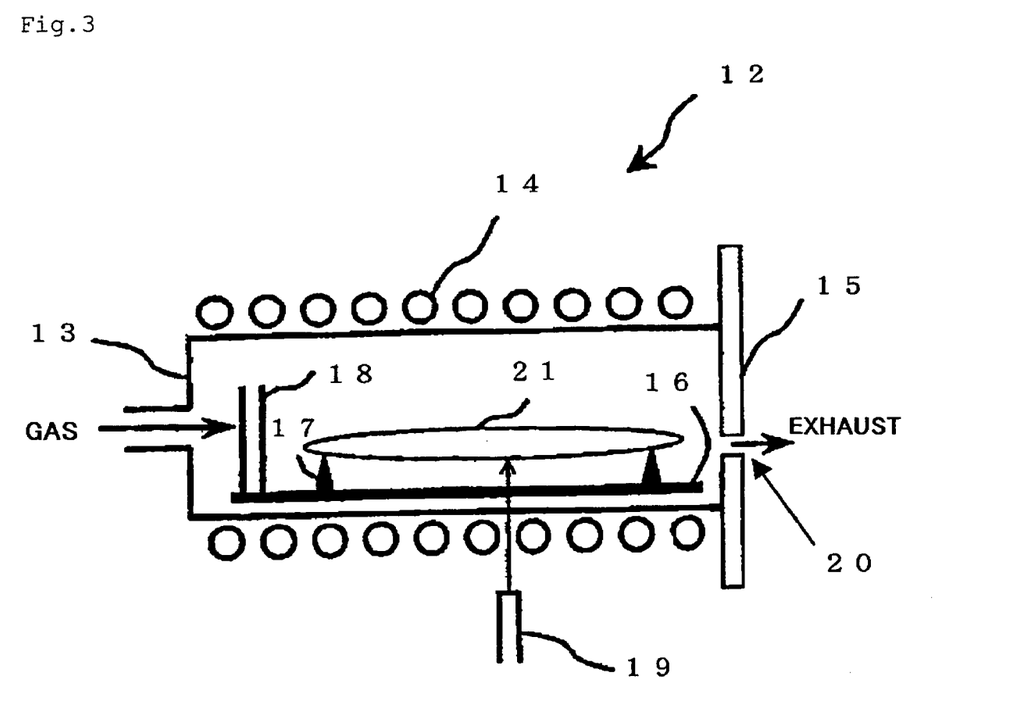
FIG. 3 is a schematic view showing one example of an RTA apparatus which can be used for the method for manufacturing the silicon wafer of the present invention.

A rapid heating and rapid cooling apparatus 12 shown in FIG. 3 has a chamber 13 composed of quartz, and performs heat treatment to the silicon wafer 21 within this chamber 13. The heating is performed by heat lamps 14 arranged so as to surround the chamber 13 from the left, right, top and bottom thereof. The heat lamps 14 can control electric powers supplied independently, respectively.

An auto shutter 15 is equipped on an exhaust side of gas to block outside air. The auto shutter 15 is provided with a wafer insertion port, which is not shown, openably and closably constituted by a gate valve. The auto shutter 15 is also provided with a gas exhaust port 20, and a furnace atmosphere can be adjusted.

The silicon wafer 21 is then arranged on a three-point supporting part 17 formed on a quartz tray 16. A buffer 18 made from quartz is provided on a gas inlet side of the tray 16, so that it is possible to prevent the silicon wafer 21 from being directly exposed to introduced gas.

Meanwhile, the chamber 13 is provided with a particular window for temperature measurement which is not shown, so that the temperature of the silicon wafer 21 can be measured by a pyrometer 19 arranged outside the chamber 13 through the particular window.

An apparatus that performs heat treatment to the silicon wafer to be processed only in the surface layer region by, for example, laser will also be described, hereinafter.

Figure 4:
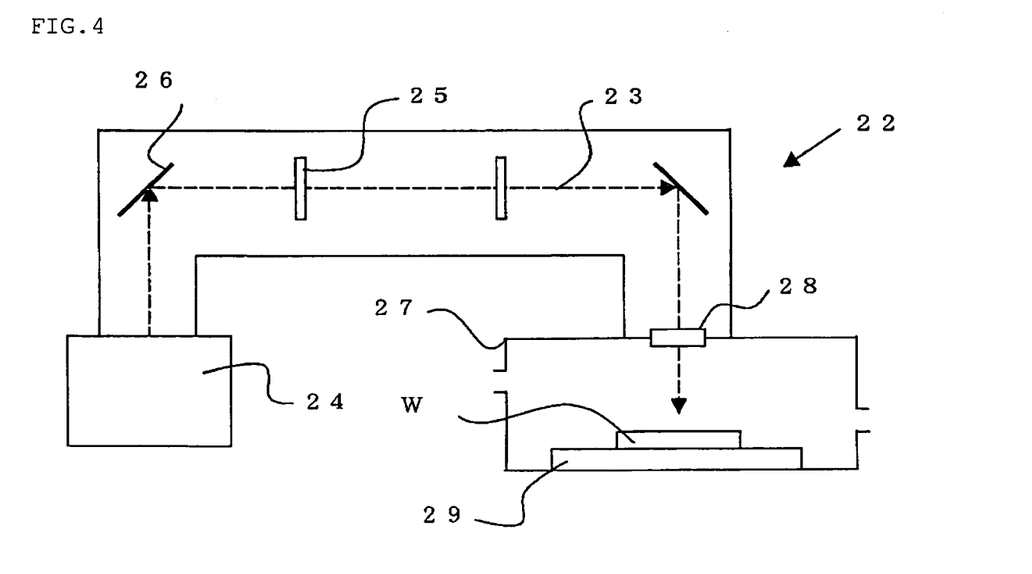
FIG. 4 is a schematic view showing one example of a laser annealing apparatus which can be used for the method for manufacturing the silicon wafer of the present invention.

One example of a configuration of a laser annealing apparatus is shown in FIG. 4. The laser annealing apparatus 22 is provided with a laser oscillating source 24 that generates laser beams 23 to be irradiated to a silicon wafer W to be processed, a lens 25, a mirror 26, and the like, and the laser beams 23 guided toward a chamber 27 by these are irradiated into the chamber 27 through a window 28, and is to be irradiated to the front surface of the silicon wafer W to be processed mounted on a mounting base 29. Incidentally, the mounting base 29 may not support the whole back surface of the silicon wafer, but may support a small part of the wafer, for example, only a periphery thereof. It is enough that the silicon wafer W to be processed is reliably supported and the wafer is supported so that the laser beams 23 can reliably irradiate to a desired position. The chamber 27 is also provided with a inlet port and an exhaust port for introducing and exhausting an atmosphere gas.

As described above, all of the above-described single crystal pulling apparatus, RTA apparatus, and laser annealing apparatus may be similar to the conventional apparatuses, and the configuration is not particularly limited. For example, in a case of the single crystal pulling apparatus, it may be a pulling apparatus based on a MCZ method which applies a magnetic field.

Hereinafter, each process of the flow chart shown in FIG. 1 will be described in further detail.

First, the silicon wafer to be processed is prepared as described above. In the manufacturing method of the present invention, as described below, since only the surface layer portion of this silicon wafer to be processed is heated to form the DZ layer in the surface layer, the BMD profile in the bulk region or the like may be the profile or the like of the quality level of the wafer in a state before heat treatment, namely, in a step of preparing the silicon wafer to be processed.

Hence, if the silicon wafer sliced from the silicon single crystal pulled by the Czochralski method is used as the silicon wafer to be processed, the quality level of the silicon single crystal will be reflected, and meanwhile, if the sliced wafer is subjected to heat treatment or the like, the quality level of the wafer after the processing will be reflected.

As described above, it is preferable to determine the quality level of the silicon wafer to be processed in the preparing step of this silicon wafer to be processed so as to obtain a desired quality level of the BMD profile or the like.

For example, when the silicon single crystal is pulled using the single crystal pulling apparatus 1 shown in FIG. 2, it is possible to adjust V/G by changing the pulling rate V (V/G may be adjusted by changing G by the change of the hot zone) and thereby to make the single crystal to be pulled into a single crystal in which the whole area in the radial direction is an N-region. Naturally, as for the silicon wafer sliced therefrom, the whole area in the radial direction becomes an N-region, and the Grown-in defect shall not exist therein.

Only the oxide precipitate nuclei will exist in this silicon wafer of an N-region, so that these can be annihilated by heat treatment of relatively low temperature and short time, and thus cost and processing time for forming the DZ layer can be further reduced. This is also effective for reduction in contamination and suppression in slip generation.

Here, if the oxygen concentration in this silicon single crystal is set to not less than 7 ppma to not more than 20 ppma, an amount of oxide precipitate nuclei does not become excessive, the size does not become too large, and an annealing time required for annihilation of the oxide precipitate nuclei does not take so long with regard to a wafer after the aftermentioned heat treatment to only the surface layer region, thus it is advantageous from a cost aspect. Moreover, it can be effectively prevented that oxygen re-precipitates easily by the heat treatment of the device process after the DZ layer is formed by the heat treatment and the BMD newly generates in the DZ layer formed previously. Meanwhile, it is possible to sufficiently grow the oxide precipitate nucleus to thereby form the BMD having a gettering function in the bulk region.

Meanwhile, if the silicon single crystal with a nitrogen concentration of $1\times10^{11}$ to $1\times10^{15}$ atoms/cm$^3$ is used, the size of the Grown-in defect can be reduced, and for that reason, it is possible to annihilate the defects in the surface layer region by lower temperature and shorter time annealing than a case where nitrogen is not doped to thereby obtain the DZ layer.

Additionally, by containing nitrogen, mechanical strength of the wafer can be increased and slip generation during heat treatment can be suitably prevented. Further, since BMD formation is promoted, the control range of the BMD can be increased.

If the silicon single crystal with a carbon concentration of $1 \times 10^{16}$ to $1 \times 10^{17}$ atoms/cm$^3$ is then used, the BMD is more easily formed in the bulk region by heat treatment in the device process after heat treatment to only the surface layer, so that it is possible to form a device having a higher gettering capability. Further, slip generation can be suppressed effectively.

It is to be noted that these concentrations can be adjusted by using the method similar to the conventional method. For example, in the case of the nitrogen concentration, in the Czochralski method, the silicon wafer or the like into which nitrogen is doped is thrown into the raw material in the crucible, and thus its concentration can be adjusted.

The pulled silicon single crystal in which the Grown-in defects, the oxygen concentration, and the like are thus adjusted is sliced, and the sliced wafer can be used as the silicon wafer to be processed.

Further, a wafer obtained by performing following heat treatment to the sliced silicon wafer may also be used as the silicon wafer to be processed.

Namely, heat treatment for not less than 30 min to not more than 4 hours in a temperature range of 400 to 900 degrees C. can be performed to the sliced silicon wafer using the conventional heat treatment furnace or the like, for example. The oxide precipitate nuclei formed during the growth of the single crystal can be grown and also the new oxide precipitate nuclei can be formed by performing such heat treatment, and thus if only the surface layer region is subsequently subjected to heat treatment, it is possible to manufacture the silicon wafer in which the BMD having the gettering capability is densely provided in the bulk region and the DZ layer is formed in the surface layer region. If the aforementioned temperature and time range is satisfied, growth and formation of the oxide precipitate nuclei are proper, and it is effective since it is not necessary to increase the cost and processing time required for heat treatment to only the surface layer region, and on the contrary, the oxide precipitate nuclei in the bulk region shall not be dissolved more than needs.

Alternatively, it is possible to perform RTP processing in which in a non-oxidizing atmosphere the wafer is rapidly heated to 1100 to 1300 degrees C. at a rate of temperature increase of not less than 5 degrees C./sec to keep it for 1 to 60 sec and subsequently is rapidly cooled at a rate of temperature decrease of not less than 5 degrees C./sec using, for example, the rapid heating and rapid cooling apparatus 12 shown in FIG. 3.

Since the oxygen precipitation is promoted by the aforementioned RTP processing using the vacancies injected into the inside of the wafer as a template, the BMDs can be controlled by adjusting processing conditions of this RTP processing, such as rapid heating or the like. It becomes possible to adjust to the desired BMD profile in the silicon wafer by the control described above. Upper-limits of the rate of temperature increase and rate of temperature decrease are not particularly limited, but they can be set so as to obtain the desired BMD profile. Incidentally, while nitrogen diffused into the wafer by the RTP processing increases mechanical strength of the wafer in general, there is concern that it exerts a harmful effect on device properties when it exists in the front surface, so that it is preferable that nitrogen does not exist in the surface layer but exists in the bulk.

Since nitrogen diffused into the wafer by the RTP processing is extremely easy to diffuse, nitrogen in not only the surface layer but also the bulk will exit completely by out-diffusion when the whole wafer is heated to, for example, 1000 degrees C. as the conventional way. On the contrary, as will be hereinbelow described, when only the surface layer is heated according to the present invention, nitrogen in the bulk remains without being diffused since the bulk is not heated, but nitrogen in only heated surface layer exits by out-diffusion. For this reason, mechanical strength of the wafer in the bulk is not decreased, and nitrogen in the device active region can also be removed.

According to such a manner as described above, if the silicon wafer sliced from the silicon single crystal pulled by the Czochralski method while adjusting various conditions so that the quality level of the wafer (density of the Grown-in defect, the BMD density in the bulk region, or the like) may becomes a desired quality level, or the wafer obtained by further performing heat treatment to that silicon wafer is used as the silicon wafer to be processed, it is possible to obtain the silicon wafer to be processed in which, for example, the whole area in the radial direction is an N-region and the BMD is sufficiently formed at least in the bulk region.

Accordingly, only the surface layer region to the predetermined depth from the front surface of this silicon wafer to be processed is subjected to heat treatment at a temperature of not less than 1100 degrees C., for not less than 0.01 msec to not more than 1 sec, thereby it is possible to obtain the silicon wafer in which the surface layer region to the predetermined depth is made into defect-free and the uniform DZ layer is formed and also the BMD provided with the gettering capability is sufficiently formed in the bulk region inside the wafer. Further, the BMD density is steeply changed in the boundary between the DZ layer and the BMD layer, and therefore, if the predetermined depth of the aforementioned DZ layer is adjusted so that this boundary may be a position close to the STI bottom, the stress remarkably acted to the STI bottom can be relieved, and thus allowing deformation of the silicon wafer and slip generation to be effectively prevented.

Although such heat treatment only in the surface layer region can also be performed using a flash lamp annealing apparatus or the like, it is particularly preferable to be performed using a laser annealing apparatus, for example, as shown in FIG. 4.

The laser beams 23 with a wavelength of, for example, 0.3 to 15 μm are oscillated from the laser oscillating source 24, and the laser beams 23 are irradiated to the front surface of the silicon wafer W to be processed mounted in the chamber 27. Since an irradiation time at this time is not less than 0.01 msec to not more than 1 sec and is extremely short, the temperature increase of the whole silicon wafer W to be processed by heat conduction can be ignored. When heating using such a laser annealing apparatus, it is particularly more preferable to perform the heating for 1 msec or more to 1 sec or less, and the aforementioned effect can sufficiently be obtained.

If it is a laser beam with a wavelength of not less than 0.3 μm to less than 0.7 μm, more preferably, from 0.3 to 0.5 μm, an absorption coefficient is large, and the laser beam is absorbed only in the surface layer, and thus only the surface layer can be heated efficiently. The wavelength can be increased when the DZ layer is required to a deeper position.

In this case, since a temperature distribution in the depth direction is determined by light absorption characteristics, the temperature distribution exponentially decreases from the front surface, a steep temperature profile can be achieved, and thus the steep BMD profile can be obtained.

Conversely, when the wavelength is not less than 0.7 µm, it is an infrared range and heating is possible. Further, if it is a laser beam with a wavelength of not more than 15 µm, the absorption coefficient is not too small, thus allowing a decrease in heating efficiency to be prevented. Simultaneously, it is possible to suppress that the penetration depth becomes too deep, and it is possible to prevent that the BMD cannot be formed near the device active region resulting from a deeper position being heated and the DZ layer being wider more than needs. Incidentally, when the wavelength is not less than 0.7 µm as described above, the absorption coefficient becomes small relatively, and the wafer is heated up to a deeper position, but only the surface layer can be heated efficiently by making the laser beam enter at, for example, a Brewster angle, since the laser beam is totally reflected at a shallow position of the surface layer. Additionally, since the laser beam does not enter a position deeper than the position where the laser beam is totally reflected, there is a merit that a steeper temperature distribution is obtained.

Further, there is a merit that high power $CO_2$ laser which is commercially available can be utilized although the wavelength thereof is about 10 µm.

A wavelength, an incident angle, or the like of the laser beam can be determined suitably according to the depth to be heated in the surface layer or the like.

Thus, when the laser annealing apparatus which is the single wafer processing apparatus using, for example, laser as a heat source is used, stability of laser and uniformity in the radial direction peculiar to the single wafer processing apparatus can be achieved, so that there is an advantage that a stable DZ width can be formed as compared with a case of using a conventional batch processing heat treatment furnace.

As a result of this, it is possible to obtain the wafer that has the uniform DZ layer in the radial direction, and is provided with both of a high gettering capability and a capability relaxing the stress in the STI bottom.

In a case of heat treatment of the surface layer region as described above, if it is performed in a non-oxidizing atmosphere, such as argon, hydrogen, or a mixed gas thereof, it is possible to annihilate the oxide precipitate nuclei and the Grown-in defects in the silicon wafer surface layer more easily.

Additionally, if it is performed in, for example, an atmosphere forming nitride film (for example, nitrogen or ammonia), it is possible to adjust so that the width of the DZ layer may become narrow, while if it is performed in an oxygen atmosphere, it is possible to expand the width of the DZ layer.

These atmospheres can be determined suitably freely according to a desired quality level of the silicon wafer to be manufactured.

Incidentally, in performing this heat treatment of only the surface layer region, it is preferable that the whole silicon wafer to be processed is previously heated at, for example, not less than 500 degrees C. to less than 1100 degrees. C. Pre-heating is performed to the wafer from 500 degrees C. to 1100 degrees C. in the furnace previously to then irradiate a pulsed light of a flash lamp or laser to the front surface of the wafer, thereby heat efficiency of the surface layer can be greatly improved, and the wafer is made to be easily heated more efficiently and to higher temperature than a case without pre-heating.

Particularly, it is effective when performing heat treatment of only the surface layer region using the flash lamp annealing apparatus. This is because even in a case of the flash lamp annealing apparatus which cannot increase the temperature easily to a high temperature of not less than 1100 degrees C. only by instantaneous flash irradiation, it is possible to heat the surface layer region easily to the high temperature of not less than 1100 degrees C. by such pre-heating.

Moreover, controlling the temperature of such pre-heating and further controlling the time thereof makes it possible to control the BMD density and its size in the bulk region, as described above. For example, the BMD density can be increased if the temperature of the pre-heating is 500 to 700 degrees C., while the BMD density can be reduced and the BMD with a large size can be formed if it is 700 to 1100 degrees C.

Further, pre-heating makes it possible to simultaneously perform donor annihilation heat treatment of oxygen in the bulk region, thus allowing simplification in process or the like to be achieved.

Figure 7:
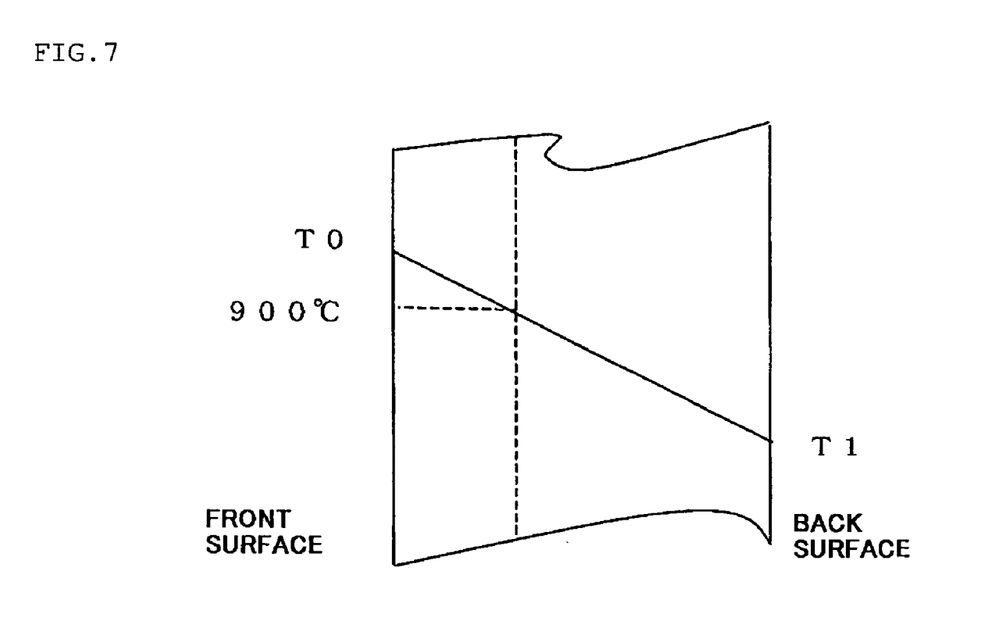
FIG. 7 is an explanatory view for describing a temperature profile of the silicon wafer in a conventional silicon manufacturing method using a heat sink.

To the method for manufacturing the silicon wafer of the present invention as described above, the conventional method includes a method in which the DZ layer is formed in the surface layer and the BMD layer is formed in the bulk region by forming a temperature difference between the front surface and back surface of the wafer according to, for example, a method disclosed in Published Japanese Translation No. 2001-517871 of the PCT International Application. A temperature distribution in the depth direction from the front surface of the wafer by such a conventional method is shown in FIG. 7. As is apparent from this figure, this conventional method can achieve a non-uniform temperature distribution, but since a light pulse is irradiated for several seconds, the temperature distribution cannot but decrease gradually linearly from the front surface toward the back surface (from front surface temperature T0 to back surface temperature T1) due to heat conduction effect. Namely, the BMD will increase in the depth direction gradually, and a steep profile in the interface between the DZ layer and the BMD as the present invention is not obtained, so that the stress in the STI bottom cannot be relieved.

Additionally, since the back surface of the wafer must be contacted to a heat sink, scratches and stains are easily generated at a contact portion, and contaminations from a heat sink member may be received.

Since a double-side polished wafer in which not only the front surface but also the back surface of the wafer are polished into a mirror surface has been employed in fabricating devices in recent years, contacting the back surface to the heat sink as described above impairs the mirror surface state largely, thus causing a serious problem.

Meanwhile, in the conventional method of Published Japanese Translation No. 2001-517871 of the PCT International Application, the temperature on the wafer front surface is 1000 degrees C. at the highest, so that although the oxide precipitate nuclei during the single crystal growth can be dissolved to some extent, the Grown-in defects such as COP or OSF nucleus can hardly be annihilated.

For this reason, in order to make the surface layer region into the DZ layer, it is necessary to use a single crystal without the Grown-in defect, so that there have been problems of causing an increase in crystal cost, and constraints of using a wafer having low oxygen from the necessity of reducing the size of the Grown-in oxide precipitate nucleus or the like.

Meanwhile, according to the manufacturing method of the present invention, unlike the conventional method, since a temperature profile which is not less than 1100 degrees C. and steep can be formed without contacting to the heat sink, the Grown-in defects and the oxide precipitates can be dissolved more easily, and the steep BMD profile can be formed. Hence, even when the silicon wafer to be processed is a wafer whose both sides of the front surface and the back surface are subjected to polishing processing, a polished state of that back surface is not affected particularly in this heat treatment, so that it is possible to provide the silicon wafer which has met needs in recent years.

Meanwhile, in the above-mentioned conventional method in which the oxygen concentration in the surface layer is reduced utilizing the out-diffusion of oxygen to make the oxygen concentration not more than a solubility limit and to annihilate the oxide precipitate nuclei and the Grown-in defects, since the width of the DZ layer and the BMD profile are affected by the effect of the variation in oxygen concentration in the wafer and the effect of the variation in temperature in the heat treatment furnace due to the use of the batch processing heat treatment furnace, it was difficult to make them uniform.

In the present invention, however, since oxygen is reduced to be not more than the solubility limit and to dissolve the defects by making only the surface layer region at high temperature, the dissolution is determined only by the temperature profile, so that the uniform DZ layer can be formed in the radial direction or between the wafers without being affected by the effect of the variation in oxygen concentration. Additionally, since such a method is employed, there is no decrease in oxygen concentration in the DZ layer, thus allowing the DZ layer having a uniform oxygen concentration distribution over the whole DZ layer to be obtained. Accordingly, unlike the conventional method, it is possible to suppress degradation of the mechanical strength in the DZ layer.

As described above, it is possible to obtain the silicon wafer which could not be obtained by the conventional method, namely, the silicon wafer having the DZ layer in the surface layer and the BMD layer having the gettering capability in the bulk region, and also having the steep BMD profile in the interface between the DZ layer and the BMD layer by the method for manufacturing the silicon wafer of the present invention. For this reason, even in the method to use STI for device isolation as in recent years, the stress in the STI bottom can sufficiently be relieved for the above-described steep BMD profile, allowing deformation of the silicon wafer and slip to be effectively prevented.

Hereinafter, while the present invention will be described in more detail by Examples and Comparative Examples, the present invention is not limited thereto.

Example 1, Comparative Example 1

According to the method disclosed in Japanese Unexamined Patent Publication (Kokai) No. H11-79889, the silicon single crystal ingot was grown by successively changing the pulling rate from 0.7 mm/min to 0.5 mm/min, while controlling so that a diameter thereof may be about 210 mm.

The defect distribution in the cross section parallel to the pulling axis in this case is shown in FIG. 5.

The Si single crystal ingot was pulled using the CZ furnace with the same hot zone (structure in the furnace) while controlling so that the pulling rate may be 0.570 mm/min (position of B-B of FIG. 5), and the wafer was prepared by slicing it the radial direction. Namely, this wafer is the wafer having a defect distribution in which there is the Nv region in the wafer central portion, and the Ni region in the peripheral portion thereof (hereinafter, it is called NvNi mixed wafer).

An oxygen concentration thereof is about 12 ppma (JEITA).

The NvNi mixed wafers thus obtained were prepared, and they were rapidly heated from a room temperature to 1200 degrees C. at a rate of temperature increase of 50 degrees C./sec in a mixed atmosphere of $NH_3$ with a flow rate of 0.5 l/min and Ar with a flow rate of 4 l/min using a commercial rapid heating and rapid cooling apparatus (RTA apparatus) (AST-2800 by Steag Co. Ltd.) to keep it for 10 sec and subsequently were rapidly cooled down at a rate of temperature decrease of 50 degrees C./sec.

Subsequently, one was kept as it was (Comparative Example 1), and the other was subjected to irradiation of the laser beam with a wavelength of 0.8 μm for 10 msec as the method for manufacturing the silicon wafer of the present invention to heat only the surface layer region at 1350 degrees C. (Example 1).

After forming a gate oxide film with a thickness of 25 nm in each silicon wafer of Comparative Example 1 and Example 1, the oxide dielectric breakdown voltages were measured.

Figure 8:
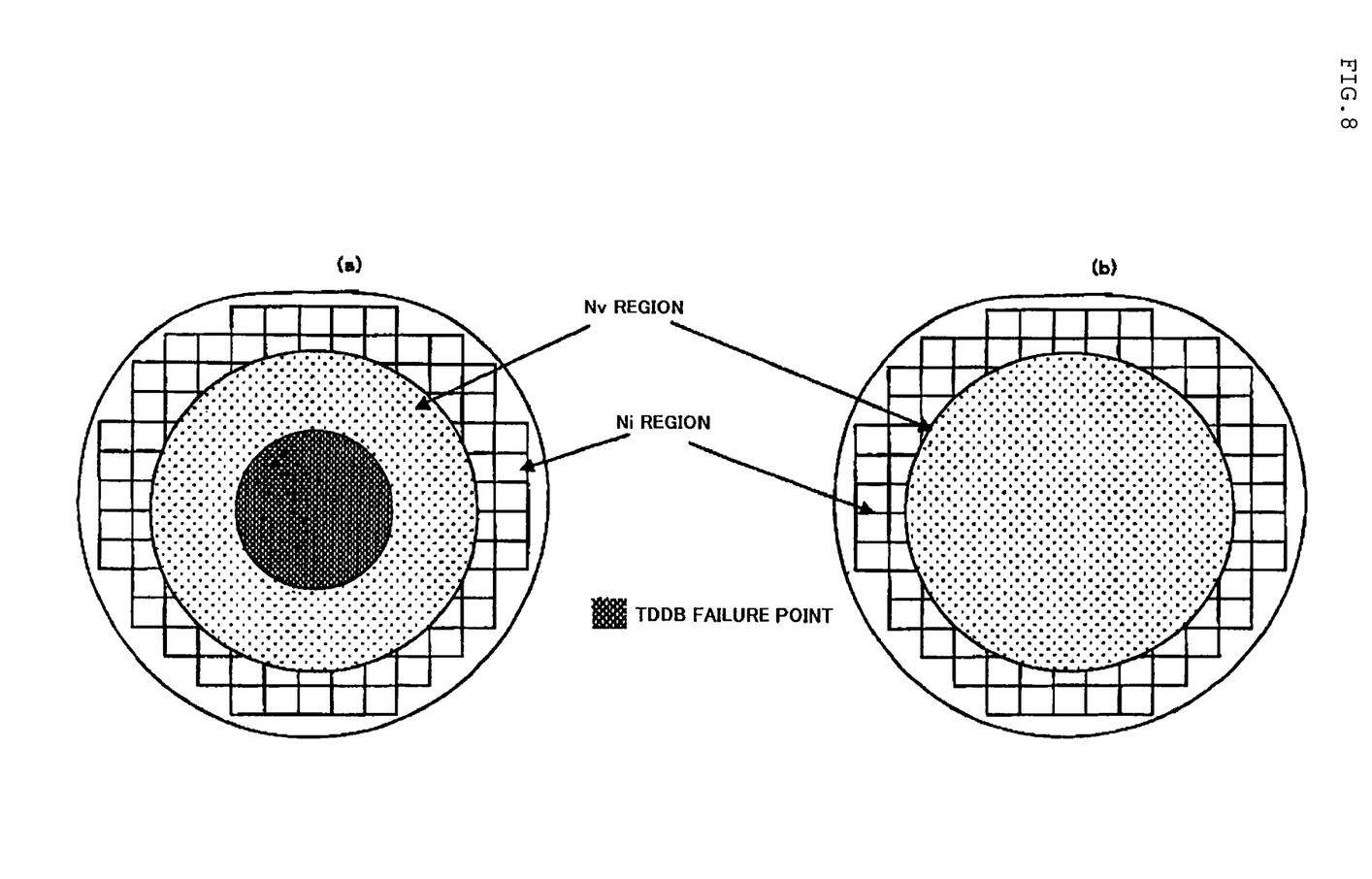
FIG. 8 is a measurement result of TDDB in Example 1 and Comparative Example 1. (a) Comparative Example 1, (b) Example 1.

FIG. 8(a) shows TDDB measurement results of the wafer in which the silicon wafer of Comparative Example 1, namely, the NvNi mixed wafer is only subjected to the RTP processing. The Nv region of the wafer is within a concentric circle with a radius of 70 mm from the wafer center, and the Ni region exists in the outside. The TDDB degradation is generated within the concentric circle of 30-40 mm from the wafer center, and it turns out that TDDB is degraded in the central portion of the Nv region. Thus, it is considered that even when the wafer whose whole area in the radial direction is an N-region is prepared as the silicon wafer to be processed, the BMD and vacancy-type defects will be formed by the RTP processing of Va being injected, and therefore the TDDB degradation has been generated.

Meanwhile, FIG. 8(b) shows TDDB measurement results of the silicon wafer of Example 1, namely, the wafer to which laser annealing is subjected after the RTP processing. TDDB in the Nv region is recovered, and it turned out that heat treatment by laser annealing is performed as the manufacturing method of the present invention, and the BMDs or the vacancy-type defects in the front surface are dissolved, thereby the surface layer is made defect-free.

Example 2, and Comparative Example 2 and Comparative Example 3

V/G was selected so that the nitrogen concentration might be $5 \times 10^{13}/cm^3$ and the whole area thereof might become an N-region upon growing the silicon single crystal by the method disclosed by Japanese Unexamined Patent Publication (Kokai) No. H11-79889, the Si single crystal ingot was pulled using the CZ furnace with the same hot zone while controlling the pulling rate so as to be the selected V/G, and the wafer was prepared by slicing it the radial direction (Comparative Example 2).

The defect distribution of this wafer is that the whole area of the wafer is an N-region, and the oxygen concentration is about 12 ppma (JEITA).

The wafer prepared in a manner similar to that of Comparative Example 2 was loaded into the heat treatment furnace at 700 degrees C. in an Ar atmosphere, was heated at the rate of temperature increase of 5 degrees C./min up to 1000 degrees C. and at the rate of temperature increase of 3 degrees C./min from 1000 to 1200 degrees C. to keep it at 1200 degrees C. for 1 hour, and is subsequently cooled down to 700 degrees C., and thereafter the wafer was taken out from the furnace (Comparative Example 3).

Meanwhile, the wafer prepared in a manner similar to that of Comparative Example 2 was subjected to irradiation of the laser beam with a wavelength of 0.8 μm for 10 msec and only the surface layer region was subjected to heat treatment at 1350 degrees C., as the present invention (Example 2).

Figure 9:
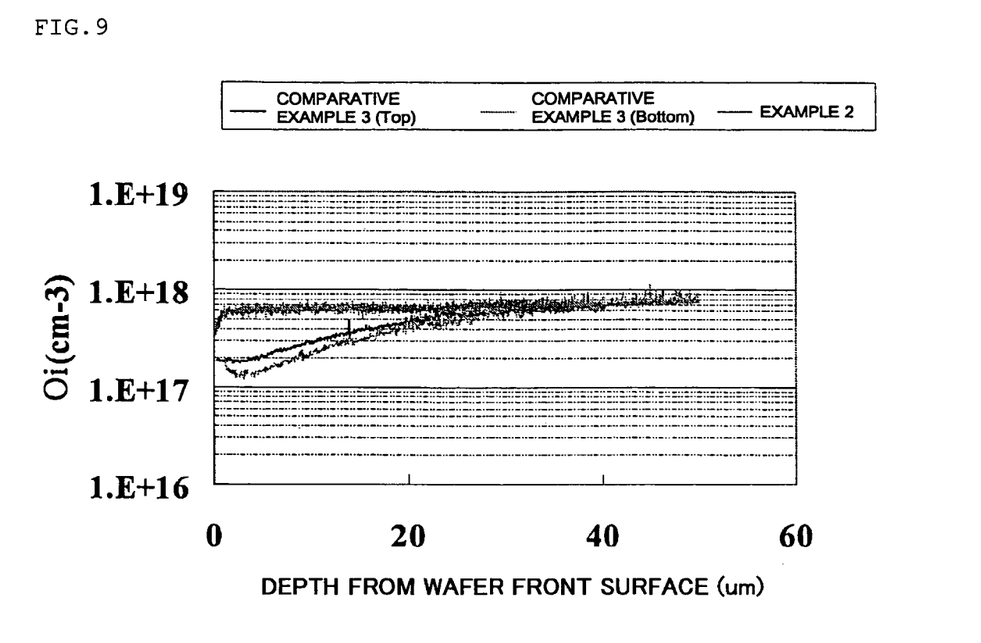
FIG. 9 is a measurement result showing a relation between a depth of the silicon wafer and an oxygen concentration distribution in Example 2 and Comparative Example 3.

As for the wafers of Comparative Example 3 and Example 2, each oxygen distribution in the depth direction was measured with SIMS (FIG. 9).

As is apparent from FIG. 9, the oxygen profile of the wafer of Comparative Example 3 subjected to high temperature heat treatment in an Ar atmosphere is a profile of typical out-diffusion, and a decrease in oxygen concentration is seen from the front surface to about 30 μm in-depth.

Moreover, it turns out that oxygen profiles are slightly different depending on a difference of a loading position of the wafer in performing Ar annealing treatment being a top side or a bottom side of the vertical furnace. It is considered that generation of temperature non-uniformity between the top side and the bottom side of the vertical furnace is a cause.

It is known that the higher the oxygen concentration is, the more the strength of the wafer increases, and a decrease in oxygen concentration in the surface layer means, namely, degradation in strength, and means that the mechanical strength of the wafer in the surface layer will be changed somewhat by the influence of the non-uniformity of the temperature in the heat treatment furnace.

As described above, in the conventional method, the oxygen concentration in the DZ layer is decreased to thereby degrade the strength thereof, and a difference in the profiles of the oxygen concentration is caused also in between the wafers, so that it is difficult to manufacture the silicon wafer with uniform quality.

Meanwhile, in the case of Example 2 in which laser annealing is performed as the present invention, approximately constant oxygen concentration distribution is provided from the front surface as is obvious from FIG. 9, and it is ideal also from the strength point of view. The difference between the wafers as Comparative Example 3 is not caused, either.

Next, as a result of measuring TDDB of the wafers of Comparative Example 2 and Comparative Example 3 and Example 2, the pass rates in a γ mode were 84%, 99%, and 100%, respectively.

These wafers are doped with nitrogen and are fabricated from the silicon single crystal ingot composed of an N-region, so that the Grown-in defects, such as COP or OSF, should not exist therein.

COP is not detected even when they are actually evaluated with a contamination inspection apparatus of a laser scattering system, and OSF is not detected from results of selectively etching them after oxidization.

It is considered from these facts that in the wafer of Comparative Example 2, namely, the wafer which is only doped with nitrogen, the Grown-in oxide precipitate nuclei appeared on the front surface to thereby degrade TDDB as a result that the oxygen precipitation was promoted by doping nitrogen. It is then considered that these oxide precipitates were annihilated or dissolved by Ar annealing (Comparative Example 3) and laser annealing (Example 2), and thereby TDDB was recovered.

Figure 10:
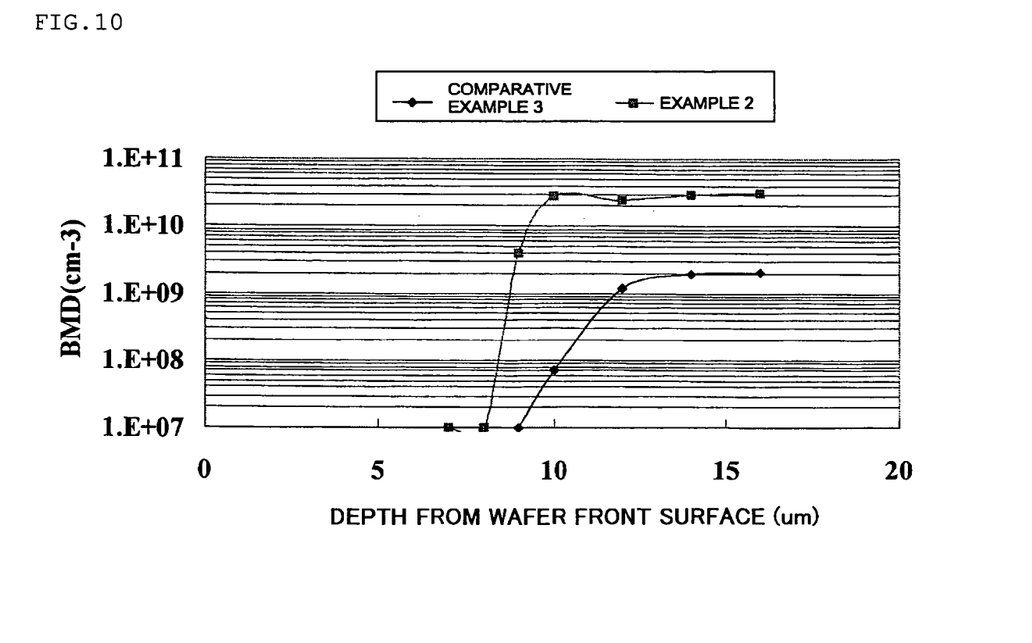
FIG. 10 is a measurement result showing a relation between a depth of the silicon wafer and a BMD density distribution in Example 2 and Comparative Example 3.

FIG. 10 shows the BMD distribution in the depth direction of the wafers of Comparative Example 3 and Example 2. This is a result in which after the wafers of Comparative Example 3 and Example 2 were subjected to heat treatment at 800 degrees C. for 4 hours in a $N_2$ atmosphere, they were heated at a rate of temperature increase of 10 degrees C./min up to 1000 degrees C. in the same heat treatment furnace, were subsequently subjected to heat treatment at 1000 degrees C. for 16 hours, and thereafter were cooled down to 700 degrees C., and then the wafers were taken out therefrom, and thereafter, angle polishing was performed thereto while putting them on a jig with an angle of about 22 degrees, and then selective etching was performed, and the BMD distribution in the depth direction was measured using a microscope.

In the case of Comparative Example 3, it gradually increases from the front surface to about 12 μm similar to the out-diffusion profile of oxygen, and the BMDs of about $1 \times 10^9$ pieces/cm$^3$ are formed in the bulk.

Meanwhile, in the case of Example 2, the BMD increases steeply at the depth of about 8 μm, and the BMD density in the bulk is also not less than $1 \times 10^{11}$ pieces/cm$^3$, resulting in generation of the BMD more than that of Comparative Example 3 by one order.

Since the oxygen concentrations of the used wafers are the same and the BMD is the oxide precipitate, existence of more BMDs by one order means that the BMD size became small.

As a result of this, as compared with the conventional method in which oxygen is reduced to the solubility limit or less by the out-diffusion of oxygen to thereby dissolve the defects, the present method in which only the surface layer is heated at a high temperature by laser irradiation to thereby dissolve them has an advantage that the steep and small sized BMDs can be formed in high density.

Even when it is considered theoretically, it turns out that in conventional method, the BMD profile and the width of the DZ layer are changed by the influence of the grown-in defects and the difference in size of the oxide precipitate nucleus caused by the variation in oxygen concentration in the wafer and the difference in thermal history of the crystal according to the portions of the ingot, and the variation in temperature in the heat treatment furnace. Whereas in the present invention, if a margin is provided to make the heating temperature higher or the heating time longer within the above-mentioned range so that defects and oxide precipitates can sufficiently be dissolved even when the difference in oxygen concentration and thermal history of the crystal are caused somewhat, it is possible to control the BMD profile and the width of the DZ layer with sufficient accuracy/repeatability without being influenced by these.

Example 3

The wafer prepared in a manner similar to that of Comparative Example 2 was subjected to irradiation of the laser beam with a wavelength of 0.488 μm for 10 msec and only the surface layer region was subjected to heat treatment at 1350 degrees C. s as the present invention. Thereafter, TDDB was measured and the oxygen concentration distribution and the BMD distribution in the depth direction of the wafer were measured.

As a result, the pass rate in the γ mode was 100% in the measurement of TDDB, and could obtain the uniform DZ layer in the surface layer. Moreover, the oxygen concentration profile and the BMD profile could be obtained as shown in Example 2 of FIG. 9 and FIG. 10. Namely, the wafer that has the uniform oxygen concentration distribution over the whole DZ layer to thereby have the sufficient strength, and also has the steep BMD profile inside the wafer could be obtained.

Example 4

The wafer prepared in a manner similar to that of Comparative Example 2 was subjected to irradiation of the laser beam with a wavelength of 10.6 μm for 10 msec and only the surface layer region was subjected to heat treatment at 1350 degrees C. s as the present invention. Thereafter, TDDB was measured and the oxygen concentration distribution and the BMD distribution in the depth direction of the wafer were measured.

As a result, the pass rate in the γ mode was 100% in the measurement of TDDB, and could obtain the uniform DZ layer in the surface layer. Moreover, the oxygen concentration profile and the BMD profile could be obtained as shown in Example 2 of FIG. 9 and FIG. 10. Namely, the wafer that has the uniform oxygen concentration distribution over the whole DZ layer to thereby have the sufficient strength, and also has the steep BMD profile inside the wafer could be obtained.

Note that the present invention is not limited to the above embodiments. The above-described embodiments are illustrations, and anything that has substantially the same configurations as technical ideas described in claims of the present invention and has similar effects is included in the technical scope of the present invention.

The invention claimed is:

1. A method for manufacturing a silicon wafer having a defect-free region in a surface layer, comprising:
   pre-heating a whole silicon wafer to be processed at not less than 500 degrees C. to less than 1100 degrees C.; and then
   subjecting only a surface layer region to a predetermined depth from a front surface of the silicon wafer to be processed to heat treatment at a temperature of not less than 1100 degrees C. for not less than 0.01 millisecond to not more than 1 second, to thereby make the surface layer defect-free,
   wherein the whole silicon wafer is sliced from a silicon single crystal ingot whose whole area in a radial direction is an N-region, the N-region being a neutral region, and the ingot being grown by the Czochralski method.

2. The method for manufacturing the silicon wafer according to claim 1, wherein the heat treatment is performed by irradiating a laser beam with a wavelength of 0.3 to 15 μm to the silicon wafer to be processed.

3. The method for manufacturing the silicon wafer according to claim 1, wherein the heat treatment is performed by irradiating a laser beam with a wavelength of 0.7 to 15 μm to the silicon wafer to be processed at a Brewster angle.

4. The method for manufacturing the silicon wafer according to claim 2, wherein the heat treatment is performed by irradiating a laser beam with a wavelength of 0.7 to 15 μm to the silicon wafer to be processed at a Brewster angle.

5. The method for manufacturing the silicon wafer according to claim 4, wherein the heat treatment is performed in a non-oxidizing atmosphere of argon, hydrogen, or a mixed gas thereof.

6. The method for manufacturing the silicon wafer according to claim 4, wherein the heat treatment is performed in an atmosphere conducive to forming nitride film of nitrogen or ammonia.

7. The method for manufacturing the silicon wafer according to claim 4, wherein the heat treatment is performed in an oxygen atmosphere.

8. The method for manufacturing the silicon wafer according to claim 7, wherein the silicon single crystal ingot grown by the Czochralski method has an oxygen concentration of not less than 7 ppma to not more than 20 ppma.

9. The method for manufacturing the silicon wafer according to claim 8, wherein the silicon single crystal ingot grown by the Czochralski method has a nitrogen concentration of $1\times10^{11}$ to $1\times10^{15}$ atoms/cm$^3$.

10. The method for manufacturing the silicon wafer according to claim 9, wherein the silicon single crystal ingot grown by the Czochralski method has a carbon concentration of $1\times10^{16}$ to $1\times10^{17}$ atoms/cm$^3$.

11. The method for manufacturing the silicon wafer according to claim 10, wherein the silicon wafer to be processed is a wafer that is sliced from a silicon single crystal ingot grown by the Czochralski method and that at least is rapidly heated to 1100 to 1300 degrees C. at a rate of temperature increase of not less than 5 degrees C/sec in a non-oxidizing atmosphere to keep it for 1 to 60 seconds and subsequently is rapidly cooled at a rate of temperature decrease of not less than 5 degrees C/sec using a rapid heating and rapid cooling apparatus and then, the silicon wafer is subjected to the pre-heating and the heat treatment of only a surface layer region.

12. The method for manufacturing the silicon wafer according to claim 11, wherein the silicon wafer to be processed is a wafer comprising a front surface that is subjected to polishing processing.

13. The method for manufacturing the silicon wafer according to claim 1, wherein the heat treatment is performed in a non-oxidizing atmosphere of argon, hydrogen, or a mixed gas thereof.

14. The method for manufacturing the silicon wafer according to claim 1, wherein the heat treatment is performed in an atmosphere conducive to forming nitride film of nitrogen or ammonia.

15. The method for manufacturing the silicon wafer according to claim 1, wherein the heat treatment is performed in an oxygen atmosphere.

16. The method for manufacturing the silicon wafer according to claim 1, wherein the silicon single crystal ingot grown by the Czochralski method has an oxygen concentration of not less than 7 ppma to not more than20 ppma.

17. The method for manufacturing the silicon wafer according to claim 1, wherein the silicon single crystal ingot grown by the Czochralski method has a nitrogen concentration of $1\times10^{11}$ to $1\times10^{15}$ atoms/cm$^3$.

18. The method for manufacturing the silicon wafer according to claim 1, wherein the silicon single crystal ingot grown by the Czochralski method has a carbon concentration of $1\times10^{16}$ to $1\times10^{17}$ atoms/cm$^3$.

19. The method for manufacturing the silicon wafer according to claim 1, wherein the silicon wafer to be processed is a wafer that is sliced from a silicon single crystal ingot grown by the Czochralski method and that at least is rapidly heated to 1100 to 1300 degrees C. at a rate of temperature increase of not less than 5 degrees C/sec in a non-oxidizing atmosphere to keep it for 1 to 60 seconds and subsequently is rapidly cooled at a rate of temperature decrease of not less than 5 degrees C/sec using a rapid heating and rapid cooling apparatus and then, the silicon wafer is subjected to the pre-heating and the heat treatment of only a surface layer region.

20. The method for manufacturing the silicon wafer according to claim 1, wherein the silicon wafer to be processed is a wafer comprising a front surface that is subjected to polishing processing.

* * * * *